CHARGISTOR SWITCHING CIRCUIT

Filed Oct. 18, 1962

INVENTOR
MURRAY J. HAIMS

BY

ATTORNEY

United States Patent Office 3,184,613
Patented May 18, 1965

3,184,613
CHARGISTOR SWITCHING CIRCUIT

Murray J. Haims, Yonkers, N.Y., assignor to International Business Machines Corporation, New York, N.Y., a corporation of New York Filed Oct. 18, 1962, Ser. No. 231,445
5 Claims. (Cl. 307—88.5)

The present invention comprises a solid state switching circuit employing a chargistor. More particularly, it comprises such a circuit utilizing a pentode chargistor having a negative transconductance region.

A new solid state electronic device constructed of doped semiconductor material known as the "chargistor" has recently been discovered by Dr. H. N. Yu. These devices are described in detail in co-pending application No. 143,132, filed October 5, 1961 by H. N. Yu. There is also a discussion of the device appearing in the IBM Journal of Research and Development, volume 5, No. 4, October 1961 on page 328, entitled "The Chargistor, a New Class of Semiconductor Devices." While a complete discussion and description of the chargistor will not be attempted here, basically it comprises a bar of either p-type or n-type high resistivity semiconductor material to which a number of rectifying contacts and control electrodes are attached. The conduction through the bar due to hole injection at one end and electron injection at the other is limited by space charges. The space charge regions exist because both holes and electrons recombine in the intrinsic body. The potential and space charge distribution in the body can be changed by the action of the control electrodes or gates which cause the current flow to be modulated in accordance therewith. The characteristic curves of these devices are somewhat analogous to those for triode, tetrode, and pentode vacuum tubes which indicate that the control electrode space charges behave in a similar manner to vacuum tube grids.

It has now been found that a novel solid state circuit can be made utilizing the unique negative transconductance characteristic of a chargistor pentode together with a silicon controlled rectifier to facilitate certain unique switching and logic operations.

It is accordingly a primary object of the invention to provide a switching circuit utilizing the normal characteristics of a pentode chargistor.

It is a further object to provide a circuit utilizing a negative transconductance characteristic to obtain unique switching and logic functions with a minimum of circuitry.

It is a further object of the invention to provide such a circuit comprised of solid state components.

The foregoing and other objects, features and advantages of the invention will be apparent from the following more particular description of preferred embodiments of the invention as illustrated in the accompanying drawings.

The objects of the present invention are accomplished in general by a switching circuit comprising in combination a chargistor pentode and a silicon controlled rectifier connected in parallel to one side of a load resistor which is in series with a common power supply for both devices. Biasing means are supplied to the control gates of the chargistor to bias same at a node point of its characteristic. When the chargistor is biased at the node point, sufficient voltage is dropped across the said load resistor whereby the silicon controlled rectifier is unable to sustain conduction. When the bias on the control gate of the chargistor is either increased or decreased, the current therethrough is reduced and the silicon controlled rectifier is able to conduct depending in turn on its state of bias.

Figure 1:
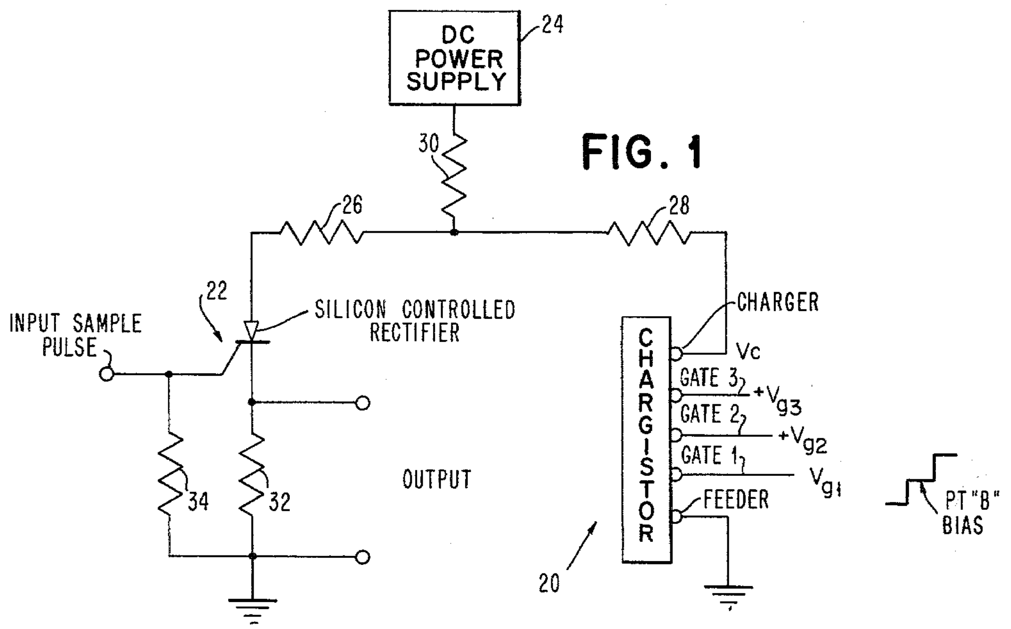
FIGURE 1 is a schematic diagram of a preferred embodiment of the invention.
Figure 2:
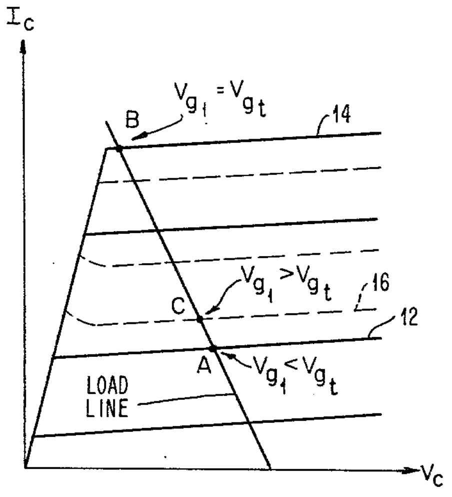
FIGURE 2 is a graph showing characteristic curves for a chargistor pentode.

The invention will now be described in more detail with respect to the drawings, wherein FIGURE 1 is a preferred embodiment of the present invention utilizing a chargistor pentode and a silicon controlled rectifier. The characteristics of the chargistor are shown in FIGURE 2, wherein charger current $I_c$ is plotted against charger voltage $V_c$. Since a complete theoretical analysis of the mode and theory of operation of a chargistor is set forth in the above identified U.S. patent application and also in the above identified article, a complete description of said operation will not be attempted here. However, for purposes of identifying parts, the feeder is analogous to the cathode of a vacuum tube and the charger to the plate. Gates 1, 2 and 3 are roughly analogous to the control, screen and suppressor grids of a vacuum tube pentode and will be referred hereinafter for convenience as the control, screen and suppressor gates.

The characteristics of the pentode chargistor which make it suitable for the instant application are shown in FIGURE 2, wherein the charger current is plotted against charger voltage with various voltages applied to control gate 1. In plotting these curves, voltages of 0.54 v. and 1.3 v. were applied to gates 2 and 3 respectively. It will be seen from the curve of FIGURE 2 that as the control or voltage at gate 1 or $V_{g1}$ is increased from 0 the characteristic $I_c$ $V_c$ curve saturation point increases up to a gate bias designated by $V_{gt}$ as represented by the solid lines in the figure. After a bias of $V_{gt}$ is reached, the characteristic starts to drop off again as indicated by the dotted lines in the figure. This particular characteristic makes possible the utilization of the pentode chargistor as a detector for voltage variations in either direction from point $V_{gt}$. Point B on the curve is the intersection of the circuit load line with the characteristic curves with a bias on gate 1 of $V_{gt}$. Thus, with a given load resistor and a given charger voltage applied, the circuit will be stable at the intersection of the load line and the characteristic curve for a voltage $V_{gt}$, or point B, as is well known in the art. It will be seen that this is the node or maximum charger current point of operation. For the above given values of screen and suppressor gate voltages, the value of $V_{gt}$ on the control gate was about .54 volt. If, however, a voltage less than $V_{gt}$ is applied to gate 1 the intersection of the load line with, for example, curve 12, will give the stable charger current for this particular gate voltage. Conversely, if the bias on gate 1 is greater than $V_{gt}$ the load line will intersect with the particular curve for this gate bias, for example, curve 16, at point C and again give a charger current as indicated by the curve at point C. Thus, it may readily be seen that if the gate 1 is biased at $V_{gt}$, that a change in this gate bias in either direction will cause a substantial reduction in charger current.

This property of the pentode chargistor to give a reduced charger current as the control gate voltage is increased past the node point $V_{gt}$ on the characteristic curve of FIGURE 2 is referred to herein as a negative transconductance region. Transconductance is usually defined as $$G_m = \frac{\Delta I_c}{\Delta V_{g1}}$$

In the instant case, the $G_m$ becomes negative when the $\Delta I_c$ goes in the negative direction.

This characteristic of the pentode chargistor is made use of in FIGURE 1, wherein the chargistor 20 is connected in parallel with a silicon controlled rectifier 22 such as a G.E. type C10. The chargistor 20 and silicon controlled rectifier are connected through their respective load resistors 26 and 28 to one terminal of a common load resistor 30, the other terminal of which is connected to the D.C. power supply 24. Also connected in series with the silicon controlled rectifier is a load resistor 32 across which the output from the circuit may conveniently be taken. Resistor 34 is merely a biasing means for the control electrode of the silicon controlled rectifier. It should be noted that the silicon controlled rectifier is essentially a solid state version as a tube type gas thyratron in that, when proper operating voltages are applied to the emitter and collector and a sufficient pulse is supplied to the control grid, the device will conduct and will continue to conduct even though the control grid pulse is removed and the only way of interrupting said conduction is to either interrupt the conductive circuit or suffiiciently lower the emitter or collector voltages depending upon which is biased. The present circuit controls the conduction of the silicon controlled rectifier 22 in the latter manner through the common resistor 30. Resistors 26, 28, 30 and 32 are chosen to be of such size, for example, 26 2K ohms, 28 500 ohms, 30 10K ohms, 32 100 ohms and 34 1K ohms, that when the chargistor is conducting in its maximum state, for example, $V_{g1}$ equal to $V_{gt}$, sufficient current is flowing through the chargistor that there will be such a voltage drop across the resistor 30 that the silicon controlled rectifier is unable to conduct regardless of the condition of its control electrode, i.e., sufficiently biased to cause conduction or not. If now the voltage on gate 1($V_{g1}$) becomes either greater than or less than $V_{gt}$, the current through the chargistor and hence through the resistor 30 diminishes, thereby diminishing the voltage drop across resistor 30. There is now sufficient voltage available from power supply 24 to allow the silicon controlled rectifier 22 to conduct if the control electrode thereof is properly biased. A value of 30 volts for the power supply 24 has been found satisfactory for this type of operation described. This voltage is less than the no bias breakdown voltage of the rectifier 22.

The circuit may be utilized in a great many ways. For example, with a fixed conductive pulse or voltage on the control electrode of the silicon controlled rectifier an output will be obtained from the circuit whenever the input to gate 1 of the chargistor varies either positively or negatively from a fixed value indicated at the point "B" bias in the small diagram to the right of FIGURE 1. The circuit could thus be used as a warning device for any set of conditions where a voltage analogue is available as an indication of a desired condition and where a variation of such voltage is indicative of a change from a desired condition.

Another possible utility for the circuit is for its obvious logic applications wherein coincidence or non-coincidence of the input sample pulse through the control electrode of the silicon controlled rectifier in conjunction with the occurrence or non-occurrence of the variation in the bias upon gate 1 ($V_{g1}$) can be utilized in a great many ways to effect various logical operations. For example, with $V_{g1}$ equal to $V_{gt}$ there is no way in which either the occurrence or non-occurrence of a pulse to the input of the silicon controlled rectifier can cause conduction thereof, however, if $V_{g1}$ is sufficiently greater or less than $V_{gt}$ an output signal from the circuit will or will not be obtained, depending upon the occurrence of an input sample pulse to the silicon controlled rectifier.

The circuit may also be utilized as a type of ternary to binary logic wherein there are three possible input conditions, i.e., $V_{g1}$ equal to, greater than, or less than $V_{gt}$ and only two possible outputs, i.e., a "0" or a "1" as indicated by non-conduction or conduction of the silicon controlled rectifier. Thus, if $V_{g1}$ equals $V_{gt}$, the output will be a "0" since the silicon controlled rectifier will not conduct under these conditions and conversely, if $V_{g1}$ is either greater than or less than $V_{gt}$, the output from the silicon controlled rectifier will be a "1" since it will conduct in either event.

The circuit employs both a silicon controlled rectifier and a chargistor which are both solid state devices which require voltages considerably higher than the usual transistor type of solid state device and they are operative with voltages up to and even in excess of 200 volts if desired, which in some instances makes them particularly adaptable to situations where transistors cannot be used. The over-all circuit is additionally extremely compact and is able to perform switching operations with far less circuitry than is normally required for this type of sense detection in switching.

While the invention has been particularly shown and described with reference to preferred embodiments thereof, it will be understood by those skilled in the art that various changes in form and details may be made therein without departing from the spirit and scope of the invention.

What is claimed is:

1. A solid state switching circuit which comprises in combination
   (*a*) a chargistor pentode having a negative transconductance region,
   (*b*) a silicon controlled rectifier connected in parallel with said chargistor,
   (*c*) a common load resistor having one terminal connected to a power supply and the other terminal connected to a common point between the chargistor and the silicon controlled rectifier,
   (*d*) means supplying bias to the control gates of said chargistor to bias same at its maximum current point and
   (*e*) input means connected to the control electrode of the silicon controlled rectifier for selectively enabling said rectifier to fire when sufficient potential appears across its anode and cathode.

2. A switching circuit as set forth in claim 1 wherein
   (*a*) means biasing the control electrode of the silicon controlled rectifier permanently to allow conduction of said device are provided and
   (*b*) a signal output load resistor is supplied in the anode-cathode circuit thereof having suitable output terminals thereacross whereby when the voltage on the control gate of the chargistor either decreases or increases substantially from the aforesaid bias the voltage drop across the common load resistor will decrease thereby allowing the silicon controlled rectifier to conduct and produce an output pulse across the output load resistor.

3. A solid state switching circuit comprising
   (*a*) a pentode chargistor having control, screen and suppressor gates and
   (*b*) a silicon controlled rectifier connected in parallel therewith both devices having one terminal connected through individual load resistors to a common terminal of a common load resistor the other terminal of which is connected to a power supply,
   (*c*) bias means for said chargistor for maintaining same in its maximum charger current condition whereby charger current will decrease upon application of either a positive or negative signal at the control gate,
   (*d*) means for selectively biasing the control electrode of the silicon controlled rectifier for selectively disabling conduction thereof and
   (*e*) an output load resistor in the silicon controlled rectifier circuit.

4. A coincidence switching circuit having
   (*a*) two inputs, one of which depicts two possible signal conditions and the other three possible signal conditions, (*b*) a chargistor pentode exhibiting a negative transconductance region and having a nodal bias point of maximum charger current, (*c*) a semiconductor thyratron having a control electrode, (*d*) means connecting the chargistor and thyratron to a first terminal of a common load resistor, the other terminal of which is connected to a common power supply, (*e*) an output load resistor in series circuit relationship with said thyratron, (*f*) means connecting the two signal condition input to the control electrode and (*g*) means connecting the three signal condition input to a control gate of the chargistor the two signal input being capable of enabling and disabling respectively conduction of said thyratron and the three signal input being such as to bias said chargistor at said nodal point and below said nodal point in each direction whereby an output signal will be produced only when said thyratron is biased to enable conduction and said chargistor is biased at a point on either side of said nodal point.

5. A solid state switching circuit which comprises in combination:

(*a*) a thyratron device, (*b*) a chargistor pentode having a negative resistance region, (*c*) means to normally bias said chargistor at its maximum conduction point, (*d*) a common power supply means and load resistor for supplying operating voltages to both said chargistor and thyratron in parallel, said load resistor being of such size as to prevent conduction of said thyratron when said chargistor is conducting at its maximum, (*e*) means to detect the conductivity state of said thyratron, and (*f*) input means for supplying pulses to both the control electrode of said thyratron and said chargistor.

References Cited by the Examiner

UNITED STATES PATENTS 2,193,578 3/40 Bruce ------------------ 328—252

FOREIGN PATENTS 127,712 4/32 Australia.

ARTHUR GAUSS, *Primary Examiner.*